United States Patent [19]

French

[11] Patent Number: 5,055,668

[45] Date of Patent: Oct. 8, 1991

[54] PHOTO-SENSOR CELL SUITABLE FOR IC CHIP

[75] Inventor: Patrick J. French, Yokosuka, Japan

[73] Assignee: Nissan Motor Co., Ltd., Yokohama, Japan

[21] Appl. No.: 497,314

[22] Filed: Mar. 22, 1990

[30] Foreign Application Priority Data

May 24, 1989 [JP] Japan .................................. 1-128640

[51] Int. Cl.$^5$ ............................................. H01J 40/14
[52] U.S. Cl. ............................. 250/208.2; 250/213 A; 250/208.4; 307/311
[58] Field of Search ............. 250/213 A, 208.4, 208.5, 250/208.2; 307/311

[56] References Cited

U.S. PATENT DOCUMENTS

| 3,159,749 | 12/1964 | Dalrymple et al. ............... 250/208.5 |
| 3,629,590 | 12/1971 | Case .................................. 250/208.4 |
| 3,671,752 | 6/1972 | Bostrom ............................ 250/208.4 |
| 4,316,104 | 2/1982 | Rösler ................................. 307/311 |
| 4,447,746 | 5/1984 | Fang et al. ........................... 307/311 |
| 4,506,151 | 3/1985 | MacDonald et al. ........... 250/213 A |
| 4,678,939 | 7/1987 | Laue ................................... 307/311 |
| 4,801,821 | 1/1989 | Prevost et al. ..................... 307/311 |

FOREIGN PATENT DOCUMENTS

| 0260318 | 10/1988 | Japan ................................. 307/311 |
| 1370774 | 1/1988 | U.S.S.R. ............................. 307/311 |

OTHER PUBLICATIONS

Kazuhira Kakao et al., "Optoelectric Device with Optical-IC," Sharp Technical Report, No. 26, Jun. 1982, pp. 127-130.

Primary Examiner—David C. Nelms
Assistant Examiner—Michael Messinger
Attorney, Agent, or Firm—Foley & Lardner

[57] ABSTRACT

The photo-sensor cell comprises two optical flip-flop sensors having two different light intensity thresholds, respectively, under imbalanced load offset conditions, two logic cells for latching only two different binary level signals from the two optical sensor respectively, without latching two of the same binary level signals from the two optical sensors due to a high or low pulsed power supply, and an output logic cell for generating an output binary signal from the time when light intensity rises beyond a higher threshold to the time when it drops below a lower threshold. Since all the elements are standardized in an IC manufacturing process and further no synchronizing clock signals are required between cells and signal processing logic owing to latch operations when a number of cells are connected in series or parallel, it is possible to realize a compact digital photo-sensor cell assembly with hysteresis activated by a pulsed power supply.

11 Claims, 6 Drawing Sheets

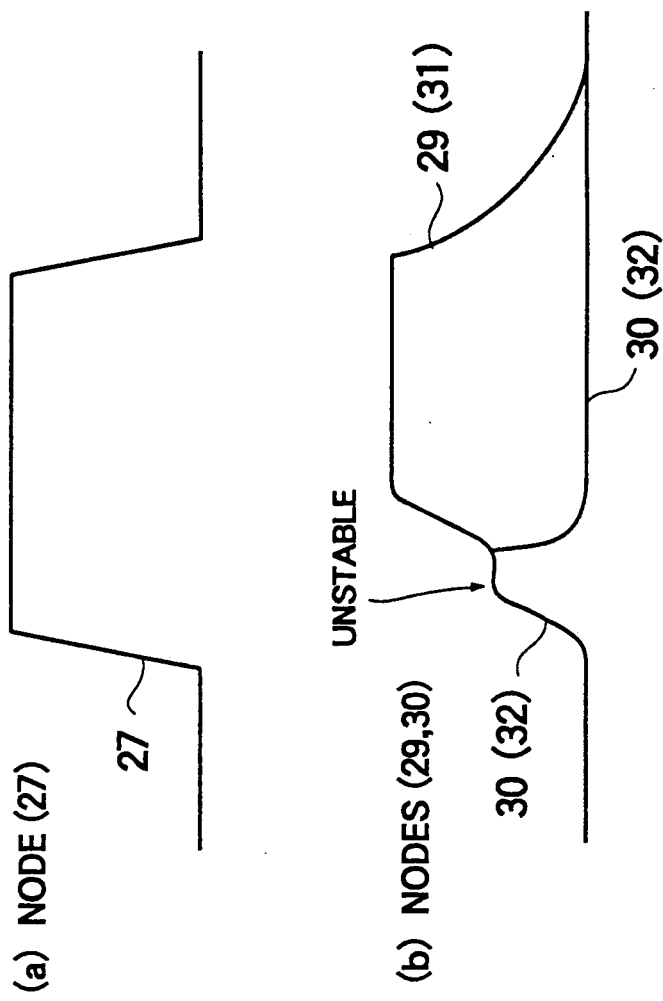
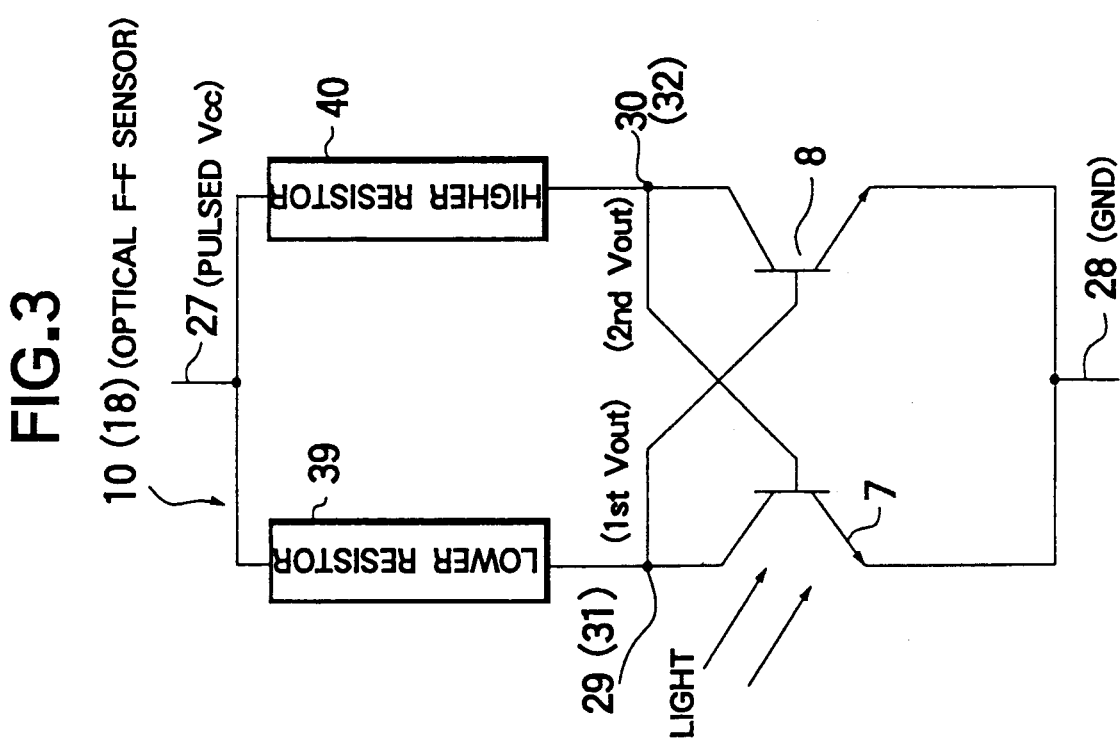

FIG.5 (A)

1st LOGIC CELL (11)

| | INPUT | | OUTPUT | |
|---|---|---|---|---|
| | 29 | 30 | 33 | 34 |
| PULSE LOW | 0 | 0 | BS n-1 | BS n-1 |
| LIGHT | 0 | 1 | 1 | 0 |
| NO LIGHT | 1 | 0 | 0 | 1 |
| UNSTABLE | 1 | 1 | BS n-1 | BS n-1 |

BS n-1 : PRECEDING BINARY SIG

FIG.5 (B)

2nd LOGIC CELL (19)

| | INPUT | | OUTPUT | |
|---|---|---|---|---|
| | 31 | 32 | 35 | 36 |
| PULSE LOW | 0 | 0 | BS n-1 | BS n-1 |
| LIGHT | 0 | 1 | 1 | 0 |
| NO LIGHT | 1 | 0 | 0 | 1 |
| UNSTABLE | 1 | 1 | BS n-1 | BS n-1 |

FIG.6

OUTPUT LOGIC CELL (22)

| | INPUT | | | | OUTPUT |
|---|---|---|---|---|---|
| | 1st LOGIC CELL (11) | | 2nd LOGIC CELL (19) | | |
| | 33 | 34 | 35 | 36 | 38 |
| NO LIGHT (B) | 0 | 1 | 0 | 1 | 0 |
| UNSTABLE | 0 | 1 | 1 | 0 | BS n-1 |
| UNSTABLE | 1 | 0 | 0 | 1 | BS n-1 |
| LIGHT (A) | 1 | 0 | 1 | 0 | 1 |

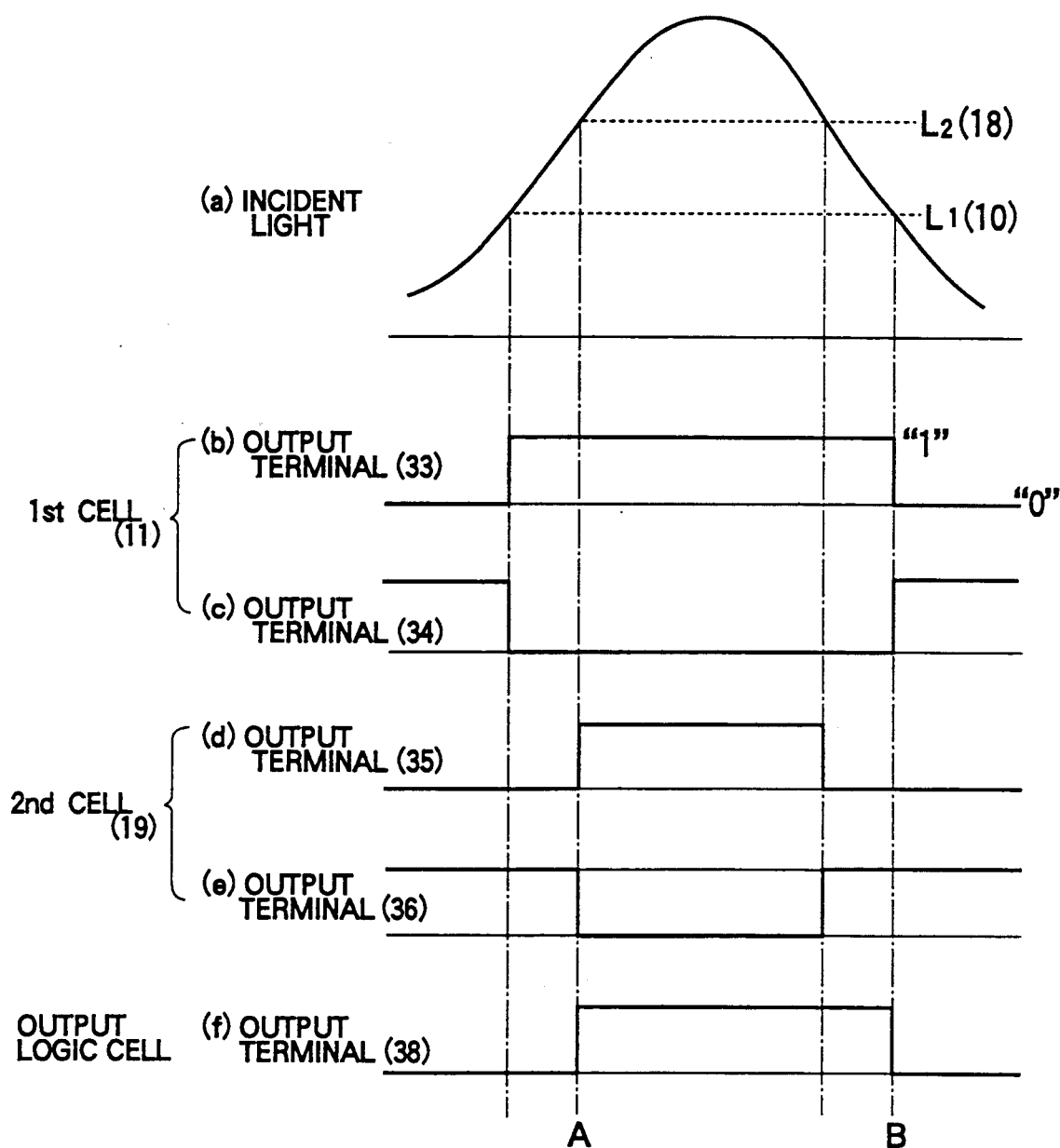

PHOTO-SENSOR CELL SUITABLE FOR IC CHIP

BACKGROUND OF THE INVENTION

1. Field of the Invention

The present invention relates to a photo-sensor cell suitable for use as a photo-sensor for detecting rectilinear or angular position or displacement when a number of photo-sensor cells are integrated into a single chip.

2. Description of the Prior Art

FIG. 1 shows a typical example of prior-art photo-sensor circuits, which comprises a light sensing element and a signal processing circuit integrated into a single chip, as disclosed in "SHARP TECHNICAL REPORT" No. 26, pages 127 to 130, June 1982. In FIG. 1, each photo-sensor circuit comprises a photodiode 1, an amplifier 2 connected to the photodiode 1, a Schmitt trigger circuit 3 triggered by an output signal of the amplifier 2 so as to provide a hysteresis, an output transistor 4 for amplifying an output signal of the Schmitt trigger circuit 3, a load resistor 5 connected to a collector of the output transistor 4, and a supply voltage stabilizer 6 for supplying a stabilized supply voltage to the photo-sensor circuit. Here, the Schmitt circuit outputs a high-voltage level output signal (e.g. "1") when an input signal voltage rises beyond a predetermined DC level (e.g. determined by an emitter resistor) and a low-voltage level output signal (e.g. "0") when the input signal voltage drops below the same DC level so as to provide hysteresis due to the presence of a turn-on voltage (e.g. base-emitter voltage) of a switching element(e.g. a transistor).

Therefore, when weak light is allowed to be incident upon the reversely-biased photodiode 1, although a small optical current flows through the photodiode 1, the Schmitt trigger circuit 3 is not turned on. However, when a strong light is allowed to be incident upon the photodiode 1, since a relatively large optical current flows through the photodiode 1, the Schmitt trigger circuit 3 is turned on, so that it is possible to obtain an output signal of "0" in response to the intensity of light allowed to be incident upon the photodiode 1. In the prior-art photo-sensor circuit, since a digital output signal can be obtained by comparing the incident light intensity (transduced into an input voltage) with a reference voltage, it is possible to eliminate unstable operation due to noise, for instance.

In the prior-art photo-sensor circuit, however, since the light current detecting section is made up of an amplifier and a Schmitt trigger circuit, when a number of circuits are integrated into a single chip, there exists a problem in that the number of elements is large and therefore the area occupied by the chip increases. In addition, since a detected incident light is compared with a reference voltage after having been transduced from light into electricity through the photodiode and the amplifier, there exist other problems in that when the reference voltage fluctuates due to temperature difference, in particular, the light sensitivity of the photo-sensor cell is unstable because of temperature dependency. The above-mentioned temperature-dependent unstability is serious, in particular when a number of series-connected photodiode and Schmitt circuits increases in a multichannel mode.

SUMMARY OF THE INVENTION

With these problems in mind, therefore, it is the primary object of the present invention to provide a photo-sensor cell composed of standardized gate circuits so as to be readily able to be integrated into a single compact chip having stable sensitivity without being subjected to the influence of temperature fluctuations.

To achieve the above-mentioned object, the photo-sensor cell according to the present invention comprises (a) a first optical flip-flop sensor (10) for generating two different binary level signals from a pulsed supply voltage when the intensity of light allowed to be incident thereupon rises beyond or drops below a first incident light threshold ($L_1$), respectively; (b) a second optical flip-flop sensor (18) for generating two different binary level signals from a pulsed supply voltage when the intensity of light allowed to be incident thereupon rises beyond or drops below a second incident light threshold ($L_2$) higher than the first threshold ($L_1$), respectively; (c) a first logic cell (11) responsive to said first optical flip-flop sensor, for latching the two different binary level signals generated by said first optical flip-flop sensor and generating two different binary level signals corresponding to the latched signals, when said first optical flip-flop sensor generates two of the same binary level signals simultaneously, said first logic cell keeping the two preceding different binary level signals latched; (d) a second logic cell (19) responsive to said second optical flip-flop sensor for latching the two different binary level signals generated by said second optical flip-flop sensor and generating two different binary level signals corresponding to the latched signals, when said second optical flip-flop sensor generates two of the same binary level signals simultaneously, said second logic cell keeping the two preceding different binary level signals latched; and (e) an output logic cell (22) responsive to the first and second logic cells for generating an output binary signal on the basis of the four latched signals of the first and second logic cells from the time when the intensity of light allowed to be incident upon the second optical flip-flop sensor rises beyond the second threshold ($L_2$) to the time when the intensity of light allowed to be incident upon the first optical flip-flop sensor drops below the first threshold ($L_1$), in such a way as to provide hysteresis for the optical sensor cell.

In the photo-sensor cell according to the present invention, since all the elements are standardized in an integrated circuit manufacturing process, it is possible to integrate the photo-sensor cell into a single compact chip. Further, when the optical flip-flop sensors are operated by a pulsed supply voltage, synchronizing clock signals are conventionally required between flip-flop sensors and their signal processing logic and therefore the chip area increases and a more complicated circuit configuration is needed. In the present invention, however, since only two different-level binary signals of the stably switched optical flip-flop sensor are latched by the logic cell, without latching the two same-level binary signals of the unstable optical flip-flop sensor due to an unstable pulsed supply voltage, it is possible to operate series- or parallel-connected photo-sensor cells without any synchronizing clock signals between the sensor and the signal processing logic, thus further facilitating the integration of the photo-sensor assembly. Furthermore, since the transduced voltage indicative of the incident light intensity is not compared with a reference DC voltage, it is possible to provide a stable photo-sensor cell without being subjected to the influence of temperature.

BACKGROUND OF THE INVENTION

FIG. 3 is a circuit diagram showing an optical flip-flop sensor circuit incorporated in the photo-sensor cell shown in FIG. 2;

FIG. 4 is a timing chart showing the output waveforms at the input and output nodes of the optical flip-flop sensor circuit shown in FIG. 3, for assistance in explaining the operation thereof;

Figure 2:
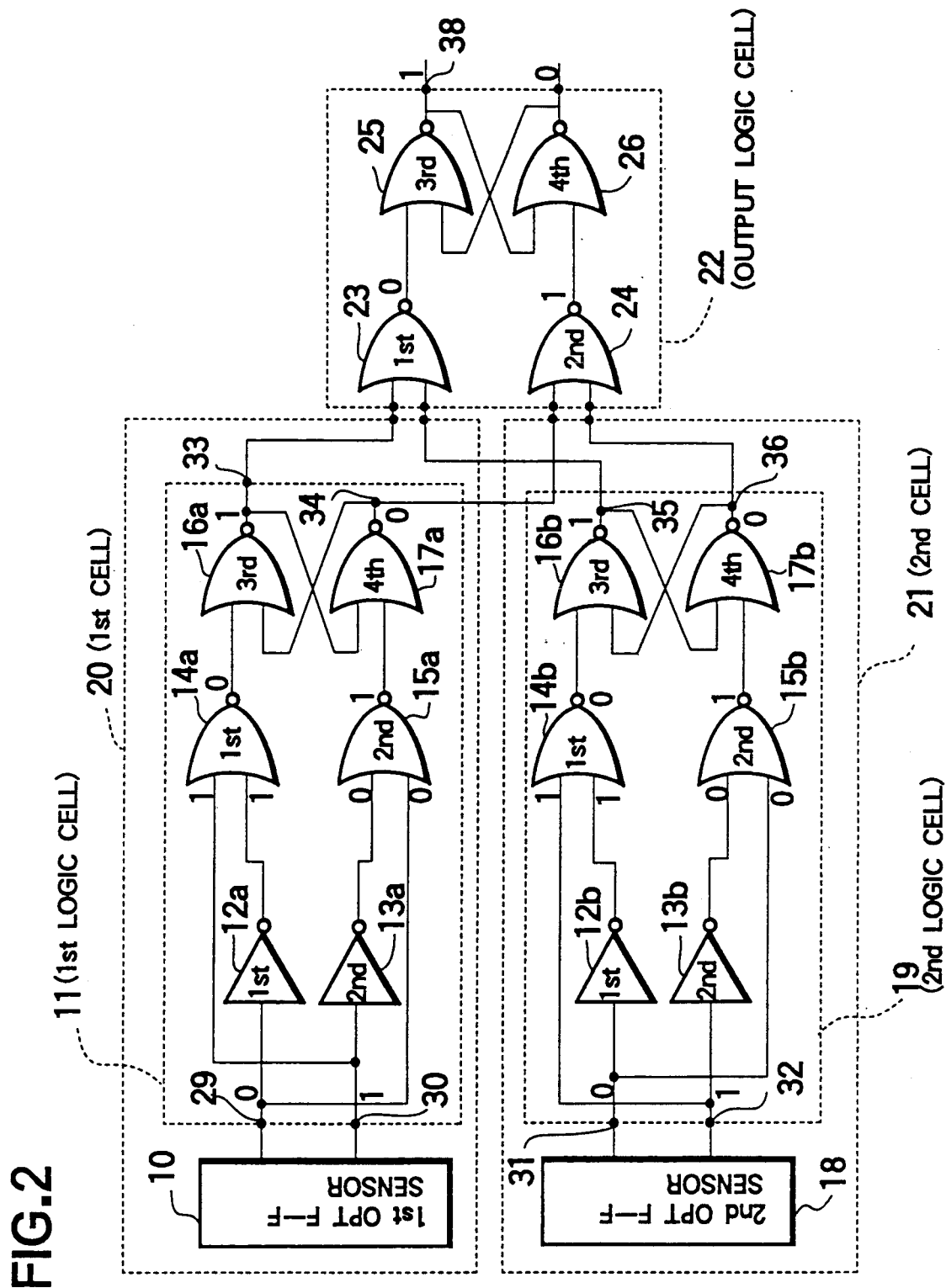
FIG. 2 is an entire circuit configuration showing an embodiment of the photo-sensor cell according to the present invention.
Figure 9:
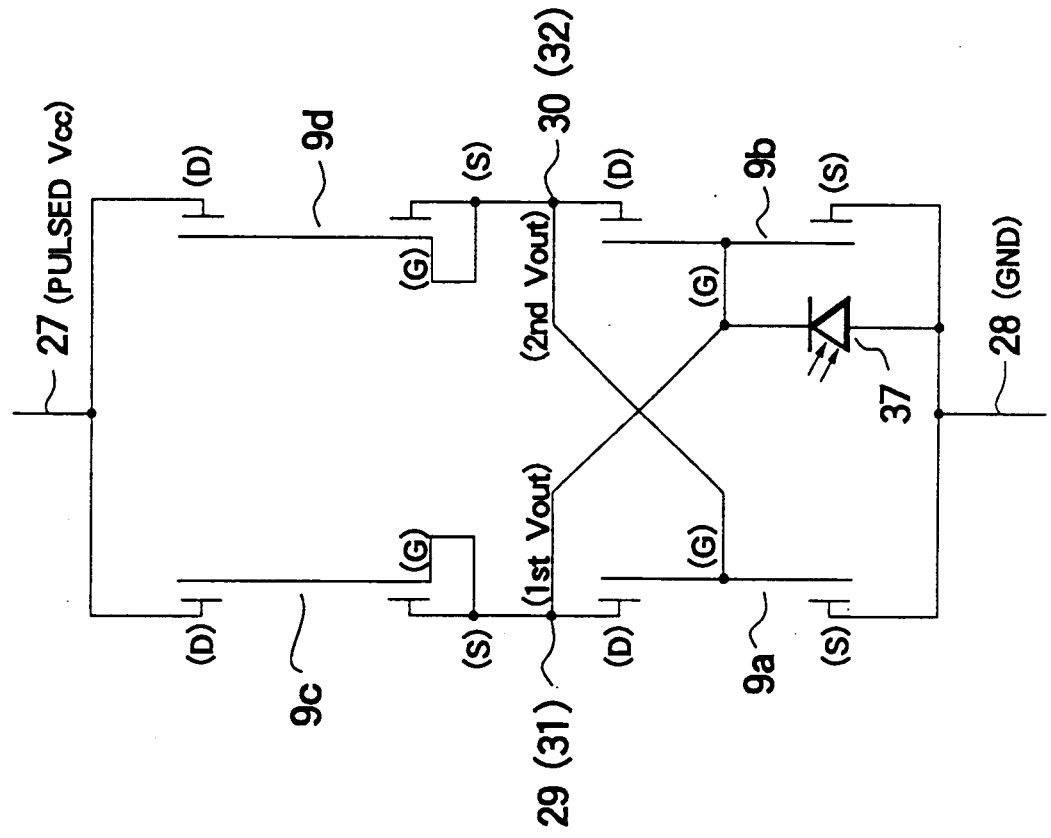
Figure 8:
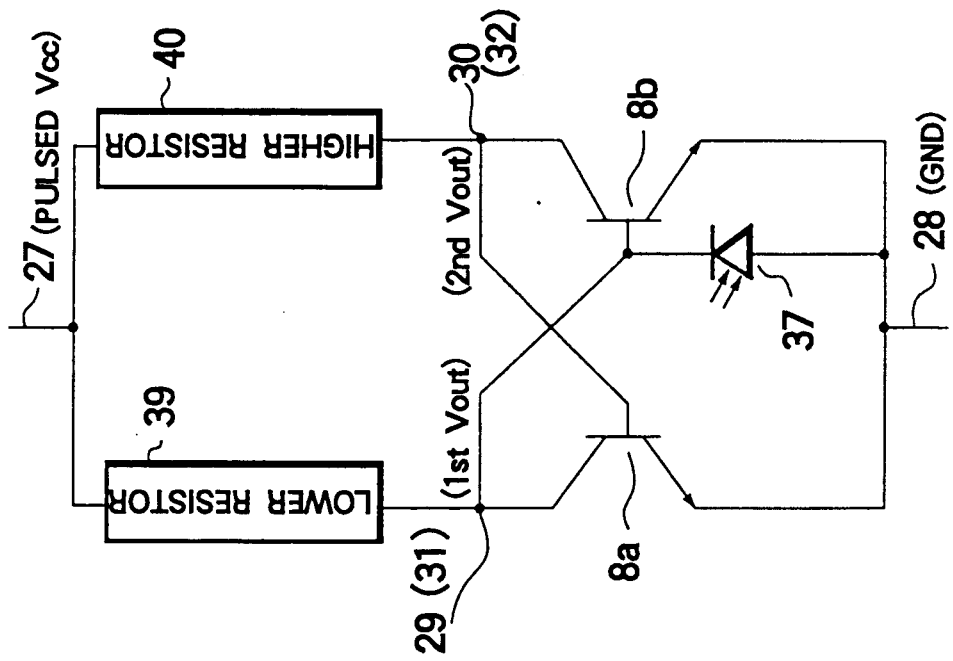

FIGS. 5(A) and (B) are logic tables showing the relationship between the input and output binary signals of the first and second logic cells incorporated in the photo-sensor cell shown in FIG. 2;

FIG. 6 is a similar logic table showing the relationship between the input and output binary signals of the output logic cell incorporated in the photo-sensor cell shown in FIG. 3;

FIG. 7 is another timing chart showing the binary signal waveforms in response to an incident light at various terminals of the photo-sensor cell shown in FIG. 2, for assistance in explaining the operation thereof;

FIG. 8 is another circuit diagram showing a first modification of the optical flip-flop sensor incorporated in the photo-sensor according to the present invention; and FIG. 9 is the other circuit diagram showing a second modification of the optical flip-flop sensor incorporated in the photo-sensor according to the present invention.

DETAILED DESCRIPTION OF THE PREFERRED EMBODIMENTS

An embodiment of the photo-sensor cell according to the present invention will be described hereinbelow with reference to the attached drawings.

In FIG. 2, the photo-sensor cell comprises a first cell 20, a second cell 21, and an output logic cell 22, which can be all manufactured in accordance with a standardized digital integrated circuit manufacturing process and can be integrated into a compact single chip. The first cell 20 comprises a first optical flip-flop sensor circuit 10 and a first logic cell 11. The second cell 21 comprises similarly a second optical flip-flop sensor circuit 18 and a second logic cell 19.

FIG. 3 shows the first or second optical flip-flop sensor circuit, which is composed of two first and second transistors 7 and 8 and two lower and higher value resistors 39 and 40 connected to two collectors 29 and 30 or 31 and 32 of the two transistors 7 and 8, respectively. In FIG. 3, two nodes 27 and 28 denote a pulsed supply voltage terminal Vcc and a ground terminal, respectively; and two nodes 29 and 30 or 31 and 32 denote two first and second output (collector) terminals of the two first and second transistors 7 and 8, respectively.

These transistors 7 and 8 are so formed as to provide a relatively broad base area. However, the first transistor 7 is so formed as to function as a phototransistor when the base area is irradiated with light. In contrast, the second transistor 8 is so formed as to function as an ordinary switching transistor by coating the base area with a light-shading film such as an aluminium film.

Further, the load resistance of the second transistor 8 is determined to be higher than that of the first transistor 7 under imbalanced load offset conditions. Therefore, the first phototransistor 7 is usually kept turned off (the output terminal 29 is kept at "1" level) and the second transistor 8 is usually kept turned on (the output terminal 30 is kept at "0" level), when no light is allowed to be incident upon the base area of the phototransistor 7, irrespective of the noise applied to the flip-flop circuit 10 or 18 (provided the load difference is sufficiently large to overcome noise and the parasitic setting of the flip-flop circuit).

Without being limited to the method of connecting two different load resistors to the two transistors 7 and 8, it is also possible to always turn on the transistor 8, when no light is allowed to be incident upon the phototransistor 7, by determining the area of the emitter region of the transistor 8 to be broader than that of the transistor 7.

Therefore, as shown in FIG. 4, when a pulsed supply voltage is supplied to the node 27 of the optical flip-flop sensor 10 or 18, the ordinary transistor 8 is turned on so that the output terminal 30 switches to "0" level and the phototransistor 7 is turned off so that the output terminal 29 switches to "1" level In the above turning-on or turning-off operation, there exists such unwanted states that both the terminals 29 and 30 have the same value, these are "0" (i.e. pulse voltage 27 is low) and the unstable state (See FIG. 4(B)), hereafter treated as a "1". This unwanted state could cause a 1-1 spike for terminals 29 and 30 to be transmitted to later parts of the circuit. However, these unwanted states can be removed by the two logic cells 11 or 19 provided with a latch function, as described later.

Further, the first optical flip-flop sensor 10 is so set as to be turned on or off in response to a weak incident light (low threshold) ($L_1$ in FIG. 7), and the second optical flip-flop sensor 18 is so set as to be turned on or off in response to a strong incident light (high threshold) ($L_2$ in FIG. 7). In other words, the difference in load resistance between the two transistors 7 and 8 (imbalanced load offset conditions) of the second optical flip-flop sensor 18 is determined to be larger than that of the first optical flip-flop sensor 10.

The first logic cell 11 comprises two first and second inverters 12a and 13a and four, first to fourth NOR gates 14a, 15a, 16a and 17a. The first and fourth NOR gates 16a and 17a form a first reset-set (R-S) flip-flop circuit provided with a latch function Here, "latch" implies a kind of memory circuit for keeping a certain momentary data. Further, two reference numerals 33 and 34 denote two first and second output terminals of the first logic cell 11.

The output terminal 29 of the first phototransistor 7 of the first optical flip-flop sensor 10 is connected to an input terminal of the first inverter 12a and a first input terminal of the second NOR gate 15a, and the output terminal 30 of the second ordinary transistor 8 of the first optical flip-flop sensor 10 is connected to an input terminal of the second inverter 13a and a first input terminal of the first NOR gate 14a. Further, an output terminal of the first inverter 12a is connected to a second input terminal of the first NOR gate 14a, and an output terminal of the second inverter 13a is connected to a second input terminal of the second NOR gate 15a. Further, an output terminal of the first NOR gate 14a is connected to a first input terminal of the third NOR gate 16a, and an output terminal of the second NOR gate 15a is connected to a first input terminal of the fourth NOR gate 17a. Furthermore, an output terminal of the third NOR gate 16a is connected to a second input terminal of the fourth NOR gate 17a and an output terminal of the fourth NOR gate 17a is connected to a second input terminal of the third NOR gate 16 in a cross-connection fashion.

As described later, in the first cell 20, two different binary output signals of the first optical flip-flop sensor 10 are latched by the first logic cell 11. However, the first logic cell 11 holds the preceding value, until the flip-flop sensor 10 outputs two different binary level output signals.

In the same way, the second logic cell 19 comprises two first and second inverters 12b and 13b and four first to fourth NOR gates 14b, 15b, 16b and 17b. The third and fourth NOR gates 16b and 17b form a second R-S flip-flop circuit provided with a latch function. Further, the reference numerals 35 and 36 denote two first and second output terminals of the second logic cell 19. The second optical flip-flop sensor 18 is connected to this second logic cell 19 for latching two different binary level signals of the second optical flip-flop sensor 18.

The output logic cell 22 comprises four first to fourth NOR gates 23, 24, 25 and 26. The third and fourth NOR gates 25 and 26 form a third R-S flip-flop circuit. Further, the reference numeral 38 denotes an output terminal of the output logic cell 22. The two first output terminals 33 and 35 of the two first and second logic cells 11 and 19 are connected to two input terminals of the first NOR gate 23. The two second output terminals 34 and 36 of the two first and second logic cells 11 and 19 are connected to the two input terminals of the second NOR gate 24. Further, an output terminal of the first NOR gate 23 is connected to a first input terminal of the third NOR gate 25, and an output terminal of the second NOR gate 24 is connected to a first input terminal of the fourth NOR gate 26. Furthermore, an output terminal of the third NOR gate 25 is connected to a second input terminal of the fourth NOR gate 26 and an output terminal of the fourth NOR gate 26 is connected to a second input terminal of the third NOR gate 25 in a cross-connection fashion.

This output logic cell 22 outputs a binary level signal provided with hysteresis, in response to the two outputs from the first and second logic cells 11 and 19. This hysteresis corresponds to a switching level (threshold) difference between the two optical flip-flop sensors 10 and 18, without being subjected to the influence of noise or temperature fluctuations.

With reference to FIGS. 4 to 7, the operation of the photo-sensor cell according to the present invention will be described hereinbelow.

When a pulsed supply voltage as shown in FIG. 4 is supplied to the supply voltage node 27 of the first optical flip-flop sensor 10, since there exists a difference in resistance between the two resistors 39 and 40 (the resistor 39 is lower than the resistor 40), the second ordinary transistor 8 is turned on so that the second collector terminal 30 is set to "0" as shown in FIG. 4. On the other hand, the first phototransistor 7 is turned off so that the first collector terminal 29 is set to "1" also as shown in FIG. 4. Upon application of the pulsed supply voltage to the optical flip-flop sensor, there exists unwanted states of the supply voltage. In this case, the voltages of both the terminals 29 and 30 are simultaneously at "0" or the transient state. This "0" and transient state are removed by the latch function of the first logic cell 11. In the same way, when a pulsed supply voltage is supplied to the supply voltage node 27 of the second optical flip-flop sensor 18, the second ordinary transistor 8 is turned on so that the second collector terminal 32 is set to "0", and the first phototransistor 7 is turned off so that the first collector terminal 31 is set to "1".

Under these conditions, when a light beam as shown in FIG. 7 is allowed to be incident upon the phototransistors of the two optical flip-flop sensors 10 and 18, the first optical flip-flop sensor 10 is switched when the intensity of the incident light exceeds a first light intensity level $L_1$ shown in FIG. 7, so that the first output terminal 29 is reset to "0" and the second output terminal 30 is set to "1" in the first optical sensor 10. On the other hand, the second optical flip-flop sensor 18 is switched when the intensity of the incident light exceeds a second light intensity level $L_2$ (shown in FIG. 7) higher than the first light intensity level $L_1$, so that the first output terminal 31 is reset to "0" and the second output terminal 32 is reset to "1" in the second optical sensor 18.

FIG. 5(A) shows a logic table showing the relationship between the input terminals 29 and 30 and the output terminals 33 and 34 of the first logic cell 11. In the first logic cell 11, each of the two inverters 12a and 13a inverts a binary signal, respectively; each of the two NOR gates 14a and 15a generates an ORed signal and inverts the ORed signal; and the two NOR gates 16a and 17a operate as a set-rest flip-flop circuit provided with a latch function.

With reference to the table shown in FIG. 5(A), when a light beam is allowed to be incident upon the first optical sensor 10, the terminal 29 is kept at "0" and the terminal 30 is kept at "1", so that the output terminal 33 is set or latched at "1" and the output terminal 34 is set or latched at "0", respectively. Further, when no light beam is allowed to be incident upon the first optical sensor 10, the terminal 29 is kept at "1" and the terminal 30 is kept at "0", so that the output terminal 33 is reset or latched at "0" and the output terminal 34 is reset or latched at "1", respectively.

Further, when the terminals 29 and 30 are both at "0" or "1" simultaneously, the two output terminals 33 and 34 of the first logic cell 11 are not set or reset, that is, held unchanged at "1" or "0" which has already been determined by the preceding binary signals $BS_{n-1}$, so that it is possible to remove the unwanted state.

FIG. 5(B) shows a similar logic table showing the relationship between the input terminals 31 and 32 and the output terminals 35 and 36 of the second logic cell 19. The elements and functions of the second logic cell 19 are quite the same as with the first logic cell 11, so that similar and corresponding reference numerals are retained for similar parts which have the same functions without repeating the description thereof. In summary, when a light beam is allowed to be incident upon the second optical sensor 18, the terminal 31 is at "0" and the terminal 32 is at "1", so that the output terminal 35 is at "1" and the output terminal 36 is at "0", respectively. Further, when no light beam is allowed to be incident upon the second optical sensor 18, the terminal 31 is at "1" and the terminal 32 is at "0", so that the output terminal 35 is at "0" and the output terminal 36 is at "1", respectively.

In the same way, under the unwanted state condition, the two output terminals 35 and 36 of the second logic cell 19 are held unchanged at "1" or "0" which has already been determined by the preceding binary signals BS$_{n-1}$.

FIG. 6 shows a logic table showing the relationship between the four input terminals 33, 34, 35 and 36 and the one output terminal 38 of the output logic cell 22. In the output logic cell 22, each of the two first and second NOR gates 23 and 24 generates an ORed signal and inverts the ORed signal, and two third and fourth NOR gates 25 and 26 operate as a R-S flip-flop circuit for providing hysteresis for the sensor circuit.

With reference to the logic table shown in FIG. 6, when a light beam is allowed to be incident upon the first and second optical sensors 10 and 18, since the output terminals 33 and 34 of the first logic cell 11 are at "1" and "0" and the terminals 35 and 36 of the second logic cell 22 are also at "1" and "0", the output terminal 38 of the output logic cell 22 is kept at "1". On the other hand, when no light beam is allowed to be incident upon the first and second optical sensors 10 and 18, since the output terminals 33 and 34 of the first logic cell 11 are at "0" and "1" and the output terminals 35 and 36 of the second logic cell 19 are also at "0" and "1", the output terminal 38 of the output logic cell 22 is kept at "0".

However, when the output terminals 33 and 34 of the first logic cell 11 are at "1" and "0" but the output terminals 35 and 36 of the second logic cell 19 are at "0" and "1", the output terminal 38 of the output logic cell 22 is determined by the preceding condition BS$_{n-1}$. Similarly, when the output terminals 33 and 34 of the first logic cell 11 are at "0" and "1" but the output terminals 35 and 36 of the second logic cell 19 are at "1" and "0", the output terminal 38 of the output logic cell 22 is determined by the preceding condition BS$_{n-1}$, because the R-S flip-flop circuit 25 and 26 is neither set nor reset.

Figure 1:
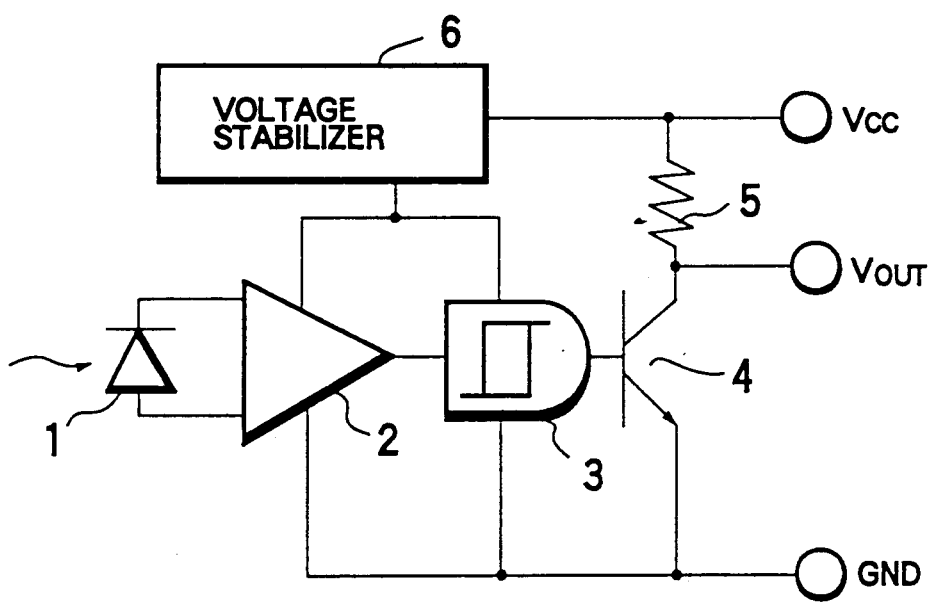
FIG. 1 is a circuit diagram showing a prior-art photo-sensor circuit.

The function of the logic table 6 is better understandable with reference to the timing chart shown in FIG. 7. FIG. 7 indicates that the output signal 38 rises to "1" when an incident light intensity increases beyond a higher threshold level L$_2$ but drops to "0" when the same incident light intensity decreases below a lower threshold level L$_1$, so as to provide a hysteresis function in the same way as in the prior-art photo-sensor including a Schmitt circuit shown in FIG. 1.

In more detail, at point A in FIG. 7, since the output terminals 33, 34, 35, and 36 are at "1", "0", "1", and "0", respectively, the output terminal 38 is turned to "1". However, at point B, since the output terminals 33, 34, 35, and 36 are at "0", "1", "0" and "1" respectively, the output terminal 38 is turned to "0". The unstable conditions other than the above are kept unchanged in accordance with the latch function of the R-S flip-flop circuits 16a and 17a, and 16b and 17b.

A number of the photo-sensor cells according to the present invention can be linked in series into an array state to detect a rectilinear position or rotation or a ring state to detect an angular position, and in series and parallel into a plate state to detect a coordinate position. When each of these photo-sensor cells is activated by a pulse supply voltage, it would normally be necessary to generate a synchronizing clock signal to sensing cells and signal processing logic, thus increasing the chip area and complicating the circuit configuration. In the present invention, however, since the unstable optical flip-flop sensor conditions of each cell can be latched at the preceding stably switched sensor conditions, irrespective of the other cells, it is possible to eliminate a synchronizing clock signal.

In this connection, the unstable flip-flop sensor conditions result from low or high pulsed supply voltage or noise. That is, when the pulsed voltage is excessively low, two low-level ("0") signals will be outputted from the optical flip-flop sensor, and when the pulsed voltage is excessively high, two high-level ("1") signals will be outputted from the optical flip-flop sensor.

In addition, in the present invention, since the presence or absence of a light beam can be detected with a hysteresis function in digital fashion, being different from the prior-art method in which the voltage level obtained by transducing a light beam intensity into electricity is compared with a reference voltage in analog fashion, it is possible to improve the photo-sensor precision without being subjected to the influence of temperature fluctuations and noise.

FIG. 8 shows another modification of the optical flip-flop sensor 10 or 18, in which two ordinary transistors 8a and 8b are connected in cross-connection manner and an additional photodiode 37 is connected between the base and the emitter terminals of the transistor 8b as a light sensing element.

In this modification, when light is not allowed to be incident upon the photodiode 37, since the resistance across the photodiode 37 is high, the transistor 8a is turned off and the transistor 8b is turned on, so that the first collector (output) terminal 29 (30) is at "1" and the second collector (output) terminal 30 (32) is at "0" However, when the intensity of the incident light exceeds a predetermined threshold level, since the resistor across the photodiode 37 decreases and therefore the base and emitter of the second transistor 8b is shorted, the optical flip-flop sensor is reversed or switched to turn on the first transistor 8a and to turn off the second transistor 8b, so that the first collector (output) terminal 29 (31) is at "0" and the second collector (output) terminal 30 (32) is at "1", respectively.

FIG. 9 shows the other modification of the optical flip-flop sensor, in which the two NPN transistors 8a and 8b shown in FIG. 8 are replaced with two NMOS (n-channel metal oxide semiconductor) FETs (field effect transistors) 9a and 9b and further the collector resistors 39 and 40 are also replaced with two NMOS FETs 9c and 9d. The function of this optical flip-flop sensor is essentially the same as that shown in FIG. 8. In this connection, the base, emitter and collector of an NPN transistor shown in FIG. 8 correspond to the gate, source and drain of a NMOS FET shown in FIG. 9.

In the above embodiment, the first and second logic cells and the output logic cell are mainly composed of NOR gates. Without being limited thereto, however, it is of course possible to configure these logic circuits by means of other logical elements such as NAND gates.

As described above, in the photo-sensor cell according to the present invention, since two optical flip-flop sensors can be used as the two optical sensor means and further the two logic cells and the output logic cell can be formed by standardized gate circuits, it is possible to integrate all cells into a single compact IC chip. Further, since only two different level binary signals generated by the first and second optical sensors are latched by two first and second logic cells, respectively before being applied to an output logic cell, no synchronizing clock signals for a pulsed supply voltage are required for the succeeding stages. Therefore, it is possible to further facilitate the integrated circuit configuration. Furthermore, since the hysteresis function can be attained in digital fashion, being different from the prior-art photo-sensor in which light intensity is first transduced into voltage and then compared with a reference voltage in analog fashion, it is possible to provide a photo-sensor of high sensitivity and high stability, without being subjected to the influence of temperature fluctuations and external noise.

What is claimed is:

1. A photo-sensor cell, comprising:
   (a) first light sensing means for generating two different switched digital level signals when incident light rises beyond or drops below a first threshold;
   (b) second light sensing means for generating two different switched digital level signals when said incident light rises beyond or drops below a second threshold higher than said first threshold;
   (c) first latching means responsive to said first light sensing means, for latching only two different switched digital level signals without latching two of the same digital level signals;
   (d) second latching means responsive to said second light sensing means, for latching only two different switched digital level signals without latching two of the same digital level signals; and
   (e) output logic means responsive to said first and second latching means, for generating a digital output signal from a time when said incident light rises beyond said second threshold to a time when said incident light drops below said first threshold, and having a hysteresis loop for said digital output signal with respect to said incident light.

2. A photo-sensor cell, comprising:
   (a) a first optical flip-flop sensor for generating two different first binary level signals from a pulsed supply voltage when an intensity of light allowed to be incident thereupon rises beyond or drops below a first incident light threshold ($L_1$), respectively;
   (b) a second optical flip-flop sensor for generating two different second binary level signals from a pulsed supply voltage when said intensity of light allowed to be incident thereupon rises beyond or drops below a second incident light threshold ($L_2$) higher than said first threshold ($L_1$), respectively;
   (c) a first logic cell responsive to said first optical flip-flop sensor, for latching said two different first binary level signals generated by said first optical flip-flop sensor as first latched signals and for generating two different binary level signals corresponding to said first latched signals and, when said first optical flip-flop sensor generates two of the same binary level signals simultaneously, said first logic cell keeping two preceding different binary level signals latched;
   (d) a second logic cell responsive to said second optical flip-flop sensor for latching said two different second binary level signals generated by said second optical flip-flop sensor as second latched signals and for generating two different binary level signals corresponding to said second latched signals and, when said second optical flip-flop sensor generates two of the same binary level signals simultaneously, said second logic cell keeping two preceding different binary level signals latched; and
   (e) an output logic cell responsive to said first and second logic cells for generating an output binary signal on the basis of said first and second latched signals of said first and second logic cells from a time when said intensity of light allowed to be incident upon said second optical flip-flop sensor rises beyond said second threshold ($L_2$) to a time when said intensity of light allowed to be incident upon said first optical flip-flop sensor drops below said first threshold ($L_1$), in such a way as to provide a hysteresis loop for said output binary signal with respect to said intensity of light for said photo-sensor cell.

3. The photo-sensor cell of claim 2, wherein each of said first and second optical flip-flop sensors comprises:
   (a) a first switching element provided with a light sensing area; and
   (b) a second switching element connected to said light switching element in cross-connection manner such that an input node of said first element is connected to an output node of said second element and vice versa under imbalanced load offset conditions, said first switching element being kept turned off and said second switching element being kept turned off when no light is allowed to be incident upon light sensing area of said first element, but said first and second switching elements being switched reversely when light is allowed to be incident upon said first element beyond a predetermined threshold.

4. The photo-sensor cell of claim 2, wherein each of said first and second optical flip-flop sensors comprises:
   (a) a first switching element;
   (b) a second switching element connected to said first switching element in cross-connection manner such that an input node of said first element is connected to an output node of said second element and vice versa, under imbalanced load resistor conditions; and
   (c) a photodiode connected to an input node of said second switching element, said first switching element being kept turned off and said second switching element being kept turned off when no light is allowed to be incident upon said photodiode, but said first and second switching elements being switched reversely when light is allowed to be incident upon said photodiode beyond a predetermined threshold.

5. The photo-sensor cell of claim 2, wherein each of said first and second logic cells comprises:
   (a) a first inverter responsive to a first binary level signal of said optical flip-flop sensor;
   (b) a second inverter responsive to a second binary level signal to said optical flip-flop sensor;
   (c) a first NOR gate connected to said first inverter and responsive to said second binary level signal of said optical flip-flop sensor;
   (d) a second NOR gate connected to said second inverter and responsive to said first binary level signal of said optical flip-flop sensor; and
   (e) a flip-flop latch composed of third and fourth NOR gates and connected to said first and second NOR gates, for latching two different binary level signals of said first and second NOR gates, respectively but keeping two preceding different latched binary level signals when said optical flip-flop sensor generates two of the same binary level signals simultaneously.

6. The photo-sensor cell of claim 2, wherein said output logic cell comprises:
   (a) a first NOR gate responsive to two first binary level signals of said first and second logic cells;

(b) a second NOR gate responsive to two second binary level signals of said first and second logic cells; and (c) a flip-flop latch composed of third and fourth NOR gates and connected to said first and second NOR gates, for generating an output binary signal when said intensity of light to said second optical flip-flop sensor rises beyond said second threshold and when said intensity of light to said first optical flip-flop sensor drops below said first threshold so as to provide a hysteresis loop characteristic for said output binary signal with respect to said intensity of light for said photo-sensor cell.

7. A photo-sensor cell comprising:

(a) a first optical flip-flop sensor for generating first and second binary signals "0" and "1" at first and second output terminals thereof, respectively, when an intensity of light allowed to be incident thereupon rises beyond a first light intensity threshold ($L_1$), and second and first binary signals "1" and "0" at said first and second output terminals thereof, respectively, when said intensity of light allowed to be incident thereupon drops below said first light intensity threshold ($L_1$), said first sensor being activated by a pulsed supply voltage;

(b) a second optical flip-flop sensor for generating first and second binary signals "0" and "1" at first and second output terminals thereof, respectively, when an intensity of light allowed to be incident thereupon rises beyond a second light intensity threshold ($L_2$) higher than said first light intensity threshold ($L_1$) and second and first binary signals "1" and "0" at said first and second output terminals thereof, respectively, when said intensity of light allowed to be incident thereupon drops below said second light intensity threshold ($L_2$), said second sensor being activated by said pulsed supply voltage;

(c) a first logic cell connected to said first optical flip-flop sensor, for latching said binary signals generated from said first optical flip-flop sensor, and generated second and first binary signals "1" and "0" at first and second output terminals thereof, respectively, in response to said first and second binary signals "0" and "1" from said first and second terminals of said first optical flip-flop sensor and said first and second binary signals "0" and "1" from said first and second output terminals, respectively, in response to said second and first binary signals "1" and "0" of said first and second terminals of said first optical flip-flop sensor, when said first optical flip-flop sensor generates two of the same binary level signals "0" or "1", said first logic cell latching two preceding different binary level signals in response to said binary signals of said first optical flip-flop sensor;

(d) a second logic cell connected to said second optical flip-flop sensor, for latching said binary signals generated by said second optical cell, and generating second and first binary signals "1" and "0" from first and second output terminals thereof, respectively, in response to said first and second binary signals "0" and "1" from said first and second terminals of said second optical flip-flop sensor and said first and second binary signals "0" and "1" from said first and second output terminals thereof, respectively, in response to said second and first terminals of said second optical flip-flop sensor, when said first optical flip-flop sensor generates two of the same binary level signals "0" and "1", said second logic cell latching two preceding different binary level signals in response to said binary signals from said second optical flip-flop sensor; and (e) an output logic cell connected to said first and second logic cells, for generating a second binary signal "0" in response to said second and first binary signals "1" and "1" of said first and second terminals of said first logic cell and said first and second terminals of said second logic cell, when said intensity of light rises beyond said second threshold $L_2$ of said second optical flip-flop sensor and drops below said first threshold $L_1$ of said first optical flip-flop sensor and a first binary signal "0" in response to said first and second binary signals "0" and "1" of said first and second terminals of said first logic cell and of said first and second terminals of said second logic cell when said intensity of light drops below said second threshold $L_2$ of said second optical flip-flop sensor and also below said first threshold $L_1$ of said first optical flip-flop sensor.

8. The photo-sensor cell of claim 2, wherein said first and second optical flip-flop sensors, said first and second logic cell and said output logic cells are configured into a single integrated circuit chip.

9. The photo-sensor cell of claim 2, wherein a number of photo-sensor cells are connected in series in an array state to detect a rectilinear position, without any synchronizing clock signals between said series-connected photo-sensor cells and additional external processing circuitry.

10. The photo-sensor cell of claim 2, wherein a number of the photo-sensor cells are connected in series in a ring state to detect an angular position, without any synchronizing clock signals between said ring-connected photosensor cells and additional external signal processing circuitry.

11. The photo-sensor cell of claim 2, wherein a number of photo-sensor cells are connected in series and parallel in an assembly to detect a coordinates position, without any synchronizing clock signals between said series and parallel connected photosensor cells and additional external signal processing circuitry.

* * * * *